(12) United States Patent  
Takahashi et al.

(10) Patent No.: US 8,513,661 B2
(45) Date of Patent: Aug. 20, 2013

(54) THIN FILM TRANSISTOR HAVING SPECIFIED TRANSMITTANCE TO LIGHT

(75) Inventors: Kenji Takahashi, Yokohama (JP); Ryo Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/743,082

(22) PCT Filed: Jan. 20, 2009

(86) PCT No.: PCT/JP2009/051142
§ 371 (c)(1),
(2), (4) Date: May 14, 2010

(87) PCT Pub. No.: WO2009/093722
PCT Pub. Date: Jul. 30, 2009

(65) Prior Publication Data
US 2010/0244022 A1     Sep. 30, 2010

(30) Foreign Application Priority Data
Jan. 23, 2008   (JP) .................................. 2008-012593

(51) Int. Cl.
*H01L 29/10* (2006.01)
(52) U.S. Cl.
USPC .................................... 257/43; 257/E29.296
(58) Field of Classification Search
USPC ..................... 257/278, 347, 250, 43, E21.411, 257/E29.296
See application file for complete search history.

(56) References Cited

U.S. PATENT DOCUMENTS

| 5,079,606 | A | | 1/1992 | Yamamura et al. | 357/23.7 |
| 5,654,573 | A | | 8/1997 | Oashi et al. | 257/349 |
| 5,818,070 | A | * | 10/1998 | Yamazaki et al. | 257/72 |
| 5,834,797 | A | * | 11/1998 | Yamanaka | 257/57 |
| 5,923,963 | A | | 7/1999 | Yamanaka | 438/157 |
| 6,291,366 | B1 | | 9/2001 | Sano et al. | 438/773 |
| 6,909,118 | B2 | | 6/2005 | Hara | 257/72 |
| 7,091,524 | B2 | | 8/2006 | Nakayama et al. | 257/94 |
| 7,145,174 | B2 | | 12/2006 | Chiang et al. | 257/59 |

(Continued)

FOREIGN PATENT DOCUMENTS

| JP | 6-350089 A | 12/1994 |
| JP | 2002-076356 A | 3/2002 |

(Continued)

OTHER PUBLICATIONS

K. Nomura et al., "Room-temperature fabrication of transparent flexible thin-film transistors using amorphous oxide semiconductors," Nature, vol. 432, pp. 488-492, Nov. 25, 2004.
T. Miyasako, et al., "Ferroelectric-gate thin-film transistors using indium-tin-oxide channel with large charge controllability", Applied Physics Letters, vol. 86, pp. 162902-1-162902-3, Apr. 12, 2005.

(Continued)

*Primary Examiner* — Bilkis Jahan
(74) *Attorney, Agent, or Firm* — Fitzpatrick, Cella, Harper & Scinto

(57) ABSTRACT

A first gate electrode (2) is formed on a substrate (1); a first gate insulating layer (3) is formed so as to cover the first gate electrode (2); a semiconductor layer (4) including an oxide semiconductor is formed on the first gate insulating layer (3); a second gate insulating layer (7) is formed on the semiconductor layer (4); a second gate electrode (8) having a thickness equal to or larger than a thickness of the first gate electrode (2) is formed on the second gate insulating layer (7); and a drain electrode (6) and a source electrode (5) are formed so as to be connected to the semiconductor layer (4).

8 Claims, 10 Drawing Sheets

U.S. PATENT DOCUMENTS

| | | |
|---|---|---|
| 7,189,992 B2 | 3/2007 | Wager, III et al. ............... 257/43 |
| 7,242,039 B2 | 7/2007 | Hoffman et al. ............... 257/213 |
| 7,282,782 B2 | 10/2007 | Hoffman et al. ................ 257/613 |
| 7,297,977 B2 | 11/2007 | Hoffman et al. ................ 257/43 |
| 7,511,343 B2 * | 3/2009 | Li et al. ......................... 257/347 |
| 2001/0030323 A1 | 10/2001 | Ikeda .............................. 257/59 |
| 2003/0049940 A1 | 3/2003 | Matsuhashi et al. ........... 438/745 |
| 2004/0197970 A1 | 10/2004 | Komatsu ....................... 438/163 |
| 2005/0199960 A1 * | 9/2005 | Hoffman et al. .............. 257/368 |
| 2005/0275038 A1 | 12/2005 | Shih et al. ..................... 257/382 |
| 2006/0170067 A1 * | 8/2006 | Maekawa et al. ............. 257/401 |
| 2007/0054507 A1 | 3/2007 | Kaji et al. ..................... 438/795 |
| 2007/0194379 A1 | 8/2007 | Hosono et al. ................ 257/347 |
| 2009/0072232 A1 | 3/2009 | Hayashi et al. ................ 257/43 |
| 2010/0044703 A1 | 2/2010 | Yabuta et al. .................. 257/43 |
| 2010/0059751 A1 | 3/2010 | Takahashi et al. ............. 257/57 |

FOREIGN PATENT DOCUMENTS

| | | |
|---|---|---|
| JP | 2003-197915 A | 7/2003 |
| JP | 2004-343018 | 12/2004 |
| JP | 2007-150157 A | 6/2007 |
| JP | 2007-194594 A | 8/2007 |
| JP | 2007-200930 A | 8/2007 |
| TW | 491983 | 6/2002 |

OTHER PUBLICATIONS

Office Action issued by JPO Nov. 20, 2012, in counterpart Japanese patent application 2008-012593, with translation.

Office Action dated Jun. 18, 2012, issued in counterpart Taiwan (R.O.C.) Patent Application No. 098102603, with English-language translation.

* cited by examiner

THIN FILM TRANSISTOR HAVING SPECIFIED TRANSMITTANCE TO LIGHT

TECHNICAL FIELD

The present invention relates to a thin film transistor and a method of producing the same. More particularly, the present invention relates to a double-gate thin film transistor and a method of producing the same.

BACKGROUND ART

A thin film transistor is a kind of a field-effect transistor and is mainly applied to an active matrix liquid crystal display and an active matrix organic EL display.

At present the mainstream of the thin film transistor is a polysilicon thin film transistor in which polycrystalline silicon is used for a semiconductor layer and an amorphous silicon thin film transistor in which amorphous silicon is used for a semiconductor layer.

With regard to the polysilicon thin film transistor in which the mobility of electrons is several hundred times greater than that of the amorphous silicon thin film transistor, not only a technology for a type formed at high temperatures but also a technology for a type formed at low temperatures has been completed, and the increase in size thereof which has been difficult is now expected to be realized.

On the other hand, the amorphous silicon thin film transistor can be produced in a large area and at low temperatures (300 to 400° C.) and has therefore become a mainstream of the thin film transistor and is utilized in various fields.

In recent years, as a new kind of a thin film transistor, a thin film transistor in which a transparent oxide polycrystalline thin film mainly formed of ZnO is used for a semiconductor layer is actively developed (Japanese Patent Application Laid-Open No. 2002-076356).

Since the above-mentioned thin film can be formed at low temperatures and is transparent with respect to visible light, a flexible transparent thin film transistor can be formed on a substrate such as a plastic plate or a film.

K. Nomura et al., Nature, Vol. 432 (2004-11), pp. 488-492 discloses a technology of using a transparent amorphous oxide semiconductor formed of indium, gallium, zinc, and oxygen for a semiconductor layer of a thin film transistor. Furthermore, it also describes that a flexible transparent thin film transistor having a large mobility can be formed on a substrate such as a polyethylene terephthalate (PET) film at room temperature.

One problem which arises when a thin film transistor is produced and used is the so-called "hump" which appears in drain current (Ids)—gate voltage (Vgs) characteristics (transfer characteristics). FIG. 1B illustrates typical transfer characteristics of a thin film transistor in which a hump is observed.

The occurrence of the hump makes conspicuous such malfunctions that a threshold value which is necessary for operating a circuit cannot be obtained or an operating point of the circuit is shifted.

For example, a driving thin film transistor in a pixel circuit of an active matrix drive organic EL display controls the emission intensity of an organic EL device by a current which flows between a drain and a source thereof. Therefore, if a hump is formed, a malfunction occurs in which a desired emission intensity cannot be obtained.

Japanese Patent Application Laid-Open Nos. 2003-197915 and 2007-200930 disclose a mechanism of forming a hump in a polysilicon thin film transistor.

More specifically, in a polysilicon thin film transistor, when there is a mesa isolation structure, a sub-channel transistor is formed in a semiconductor layer region which overlaps a gate electrode. In the sub-channel transistor, a current path is formed at a pattern edge or vicinity of a semiconductor film. The term "mesa isolation structure" herein employed refers to an isolation structure thorough mesa isolation.

In a thin film transistor having a mesa isolation structure, because an electric field concentrates on a side wall portion of a semiconductor film, the side wall portion acts as a sub-channel which is not designed, and current begins to flow through the sub-channel at a lower voltage than through a channel of the thin film transistor (becomes ON state).

Therefore, in the transfer characteristics of the TFT, abnormal current characteristics (hump) appear because the sub-channel transistor is turned on (also called "parasitic characteristics").

In order to solve this problem, in Japanese Patent Application Laid-Open No. 2003-197915, by preventing pattern edges from overlapping each other in a channel region of a semiconductor film, formation of a hump in the transfer characteristics is suppressed.

Furthermore, in Japanese Patent Application Laid-Open No. 2007-200930, by providing a thick side wall protection film on a pattern edge of a semiconductor film to thereby effectively reduce the intensity of an electric field applied to a sub-channel transistor, formation of a hump in the transfer characteristics is suppressed.

However, in the case of the above-mentioned thin film transistor in which an oxide semiconductor is used for a semiconductor layer, the mechanism of operation of the transistor is different from that of a polysilicon thin film transistor.

T. Miyasato et al., Applied Physics Letters, 86 (2005), p. 162902 discloses that a thin film transistor in which an oxide semiconductor is used for a semiconductor layer becomes OFF state by the phenomenon that a channel portion of a semiconductor film is completely depleted by application of an electric field. In other words, as the electric field is more intensely applied, the OFF state is maintained more stably.

Therefore, in the case of a thin film transistor in which an oxide semiconductor is used for a semiconductor layer, it is considered that there exists another factor for formation of a hump in the transfer characteristics than the sub-channel transistor present at pattern edges of the semiconductor film.

In the light of T. Miyasato et al., Applied Physics Letters, 86 (2005), p. 162902, there is a high probability that a hump in the transfer characteristics of a thin film transistor in which an oxide semiconductor is used for a semiconductor layer is formed due to the following factor. That is, it is considered that an interface region (back gate interface) of a semiconductor film which is opposite to an interface being in contact with a gate insulating film is different in film quality from the inside of the semiconductor film, a current path is formed.

The problem associated with a hump resulting from the back gate interface is not disclosed in Japanese Patent Application Laid-Open Nos. 2003-197915 and 2007-200930.

Meanwhile, for the purpose of preventing degradation of a thin film transistor during a device production step after formation of the thin film transistor, a protective layer is generally provided. However, particularly in a bottom gate thin film transistor, because there is only the protective layer on the semiconductor layer, if the protective layer does not function sufficiently, the back gate interface may be modified to cause a hump in the transfer characteristics.

DISCLOSURE OF THE INVENTION

Accordingly, the present invention has been accomplished in view of the above problems, and it is, therefore, an object of the present invention to provide a thin film transistor which suppresses the occurrence of a hump in the transfer characteristics of the thin film transistor in which an oxide semiconductor is used for a semiconductor layer, and a method of producing the same.

According to the present invention, in order to solve the above-mentioned problem, there is provided a thin film transistor including:

a substrate;

a first gate electrode formed on the substrate;

a first gate insulating layer formed so as to cover the first gate electrode;

a semiconductor layer including an oxide semiconductor and formed on the first gate insulating layer;

a second gate insulating layer formed on the semiconductor layer;

a second gate electrode formed on the second gate insulating layer; and a drain electrode and a source electrode formed so as to be connected to the semiconductor layer, wherein the second gate electrode has a thickness larger than a thickness of the first gate electrode.

According to the present invention, occurrence of a hump in the transfer characteristics of a thin film transistor in which an oxide semiconductor is used for a semiconductor layer can be suppressed.

Further, according to the present invention, a thin film transistor which can suppress occurrence of a hump in the transfer characteristics of the thin film transistor in which an oxide semiconductor is used for a semiconductor layer can be produced.

Further features of the present invention will become apparent from the following description of exemplary embodiments with reference to the attached drawings.

BEST MODE FOR CARRYING OUT THE INVENTION

Best mode for carrying out the present invention is described below with reference to the accompanying drawings.

Incidentally, the term "oxide semiconductor" as herein employed refers to an oxide semiconductor which changes, when used in a thin film transistor as an active layer, a drain current by at least two orders of magnitude.

Figure 2:
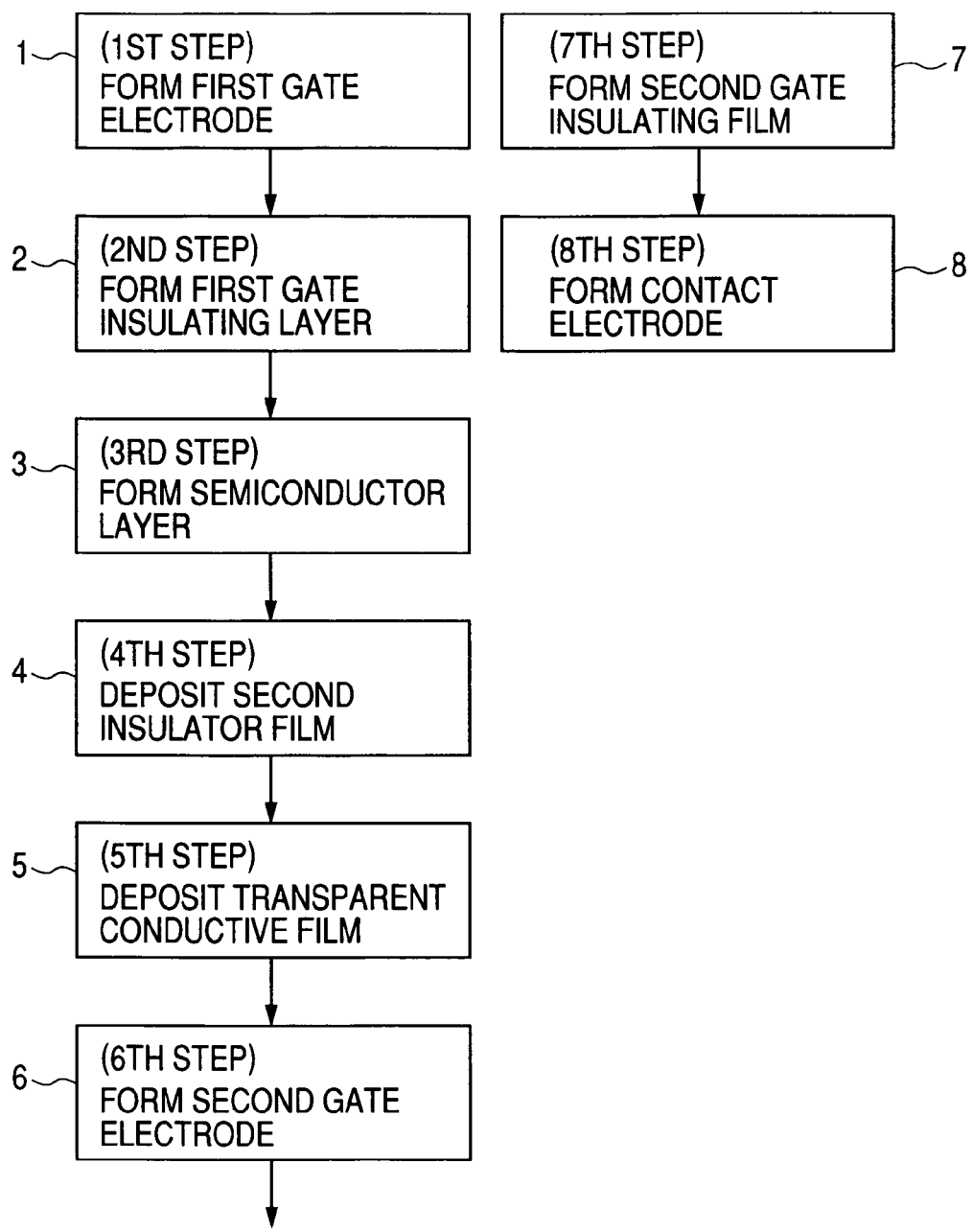
FIG. 2 is a flow chart illustrating production steps of a thin film transistor according to an embodiment of the present invention.

A method of producing a thin film transistor includes eight steps as illustrated in a flow chart of FIG. 2. FIGS. 3A, 3B, 3C, 3D, 4A, 4B and 4C are cross-sectional views illustrating the production steps of a thin film transistor according to an embodiment of the present invention. Although a planar thin film transistor is illustrated as the thin film transistor in FIGS. 3A, 3B, 3C, 3D, 4A, 4B and 4C, the configuration of the thin film transistor is not limited thereto.

Figure 5:
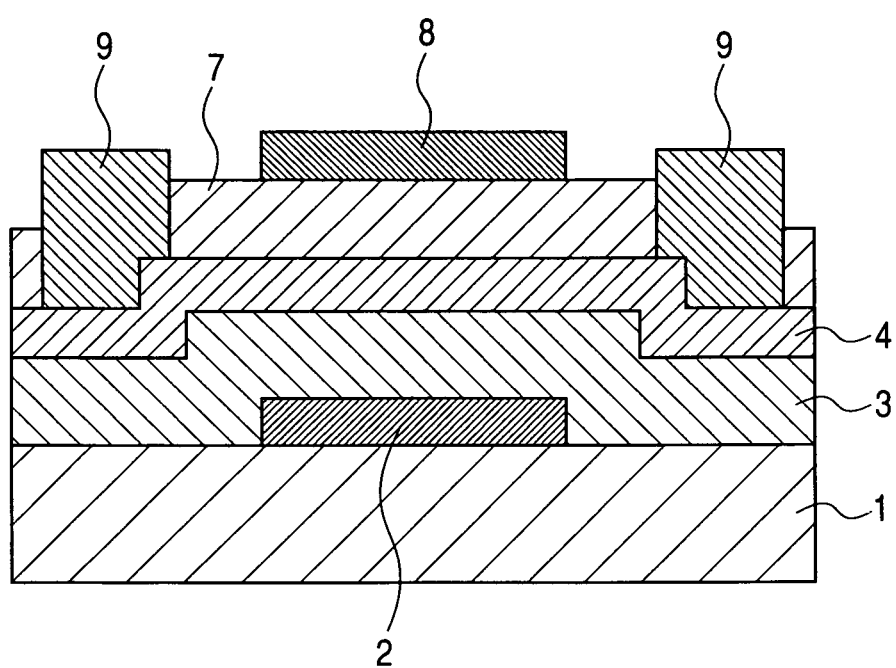
FIG. 5 is a cross-sectional view illustrating the thin film transistor according to the embodiment of the present invention.

As illustrated in FIG. 5, the thin film transistor has a structure in which a first gate electrode 2, a first gate insulating layer 3, a semiconductor layer 4, a second gate insulating layer 7, a second gate electrode 8, and contact electrodes 9 are stacked in the mentioned order on a substrate 1.

The substrate 1 is an insulating substrate. For example, the substrate 1 may be a glass substrate. Furthermore, by using an organic material or a polymer material such as polyethylene terephthalate (PET) as the substrate 1, a thin film transistor can be produced on a flexible substrate.

The contact electrodes 9 are provided for the purpose of connecting the semiconductor layer 4 and a drain electrode 5 or a source electrode 6 described later.

First, as a first step, a first conductive film is deposited on the substrate 1. A film containing at least one kind of metal is used as the first conductive film. Alternatively or additionally, a conductive metal oxide ($MO_x$ wherein M represents a metal element) may be used.

Figure 3A:
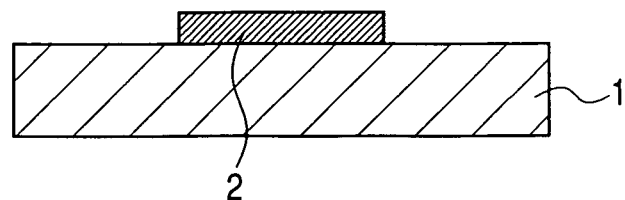
FIGS. 3A, 3B, 3C and 3D are cross-sectional views illustrating the production steps of the thin film transistor according to the embodiment of the present invention.

The first conductive film may have either a single layer structure or a stack structure consisting of a plurality of layers. As the process of forming the first conductive film, a vapor phase process such as sputtering, pulse laser evaporation, or electron beam evaporation is desirably used. However, the film formation process is not limited to those processes. Then, the first conductive film is patterned to form the first gate electrode 2. A structure formed by the process up to and including this step is illustrated in FIG. 3A.

Next, as a second step, a first insulator film is deposited on the first gate electrode 2. The first insulator film is formed of an inorganic material selected from the group consisting of oxide, carbide, nitride, fluoride, and a compound thereof. For example, a metal oxide film containing at least one kind of metal element is used as the first insulator film. Among the metal oxides, it is more desirable to use as the insulator film a metal oxide containing at least one of $SiO_2$, $Al_2O_3$, $Ga_2O_3$, $In_2O_3$, $MgO$, $CaO$, $SrO$, $BaG$, $ZnO$, $Nb_2O_5$, $Ta_2O_5$, $TiO_2$, $ZrO_2$, $HfO_2$, $CeO_2$, $Li_2O$, $Na_2O$, $K_2O$, $Rb_2O$, $Sc_2O_3$, $Y_2O_3$, $La_2O_3$, $Nd_2O_3$, $Sm_2O_3$, $Gd_2O_3$, $Dy_2O_3$, $Er_2O_3$ and $Yb_2O_3$. Alternatively or additionally, a metal nitride ($MN_x$ wherein M represents a metal element) may be used.

Furthermore, alternatively or additionally, a metal oxynitride ($MO_xN_y$ wherein M represents a metal element) may be used.

As the process of forming the first insulator film, a vapor phase process such as chemical vapor deposition, sputtering, pulse laser evaporation, or electron beam evaporation is desirably used. However, the film formation process is not limited to those processes.

Figure 3B:
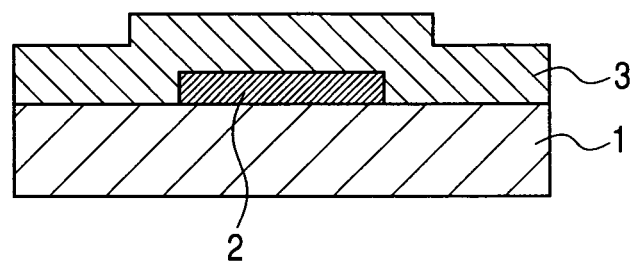

By patterning the first insulator film, the first gate insulating layer 3 is formed. A structure formed by the process up to and including this step is illustrated in FIG. 3B.

Then, as a third step, a semiconductor film is deposited on the first gate insulating layer 3. Specific examples of a preferable semiconductor film which can be adopted in the present invention include:

an oxide including ZnO as a main component;
an oxide including $In_2O_3$ as a main component;
an oxide including $Ga_2O_3$ as a main component;
an oxide including $Sn_2O3$ as a main component; and
an oxide including a composite oxide including two or more of the above-mentioned oxides as a main component.

Incidentally, the term "main component" herein employed refers to an oxide having the highest content of those oxides contained in the oxide semiconductor concerned.

Furthermore, the term "oxide semiconductor" herein employed refers to an oxide semiconductor which changes, when used in a thin film transistor as an active layer, a drain current by at least two orders of magnitude.

In particular, an oxide containing $In_2O_3$ and ZnO the molar ratio of the sum of which is ½ or more of the whole is preferable.

Alternatively or additionally, the semiconductor film may contain an oxide semiconductor such as $SnO_2$ or $TiO_x$, or a semiconductor film containing another oxide semiconductor may also be used.

As the process of forming the semiconductor film, a vapor phase process such as sputtering, pulse laser evaporation, or electron beam evaporation is desirably used. However, the film formation process is not limited to those processes.

Figure 3C:
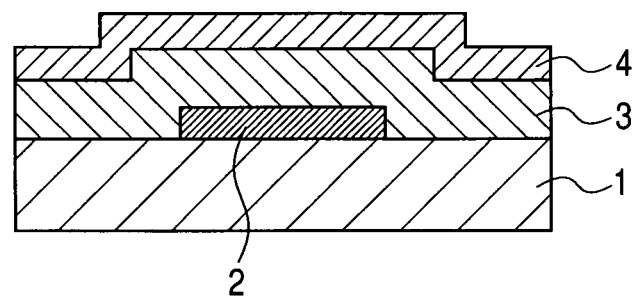

Then, by patterning the semiconductor film, the semiconductor layer 4 is formed. A structure formed by the process up to and including this step is illustrated in FIG. 3C.

Next, as a fourth step, a second insulator film is deposited on the semiconductor layer 4. The second insulator film is formed of an inorganic material selected from the group consisting of oxide, carbide, nitride, fluoride, and a compound thereof. For example, a metal oxide film containing at least one kind of metal element is used as the second insulator film.

Of the metal oxides, it is more desirable to use as the second insulator film a metal oxide containing at least one of $SiO_2$, $Al_2O_3$, $Ga_2O_3$, $In_2O_3$, MgO, CaO, SrO, BaO, ZnO, $Nb_2O_5$, $Ta_2O_5$, $TiO_2$, $ZrO_2$, $HfO_2$, $CeO_2$, $Li_2O$, $Na_2O$, $K_2O$, $Rb_2O$, $Sc_2O_3$, $Y_2O_3$, $La_2O_3$, $Nd_2O_3$, $Sm_2O_3$, $Gd_2O_3$, $Dy_2O_3$, $Er_2O_3$ and $Yb_2O_3$. Alternatively or additionally, a metal nitride ($MN_x$ wherein M represents a metal element) may be used.

Further, alternatively or additionally, a metal oxynitride ($MO_xN_y$ wherein M represents a metal element) may be used.

Figure 3D:
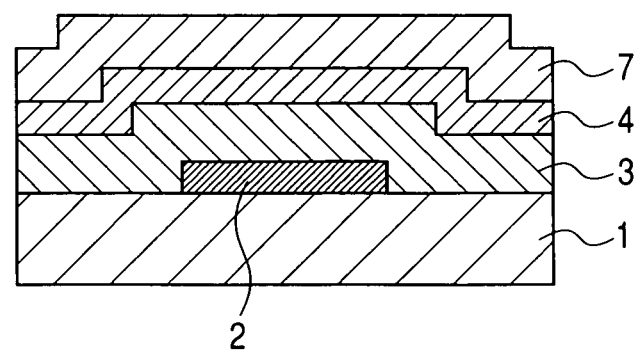

As the process of forming the second insulator film, a vapor phase process such as chemical vapor deposition, sputtering, pulse laser evaporation, or electron beam evaporation is desirably used. However, the film formation process is not limited to those processes. Through the above-mentioned steps, a structure illustrated in FIG. 3D is completed.

Then, as a fifth step, a transparent conductive film is deposited on the second insulator film. It is preferable that ITO which is a solid solution of $In_2O_3$ and $SnO_2$ be used as the transparent conductive film. It is also preferable that an oxide material containing at least one of In, Sn and Zn be used as the transparent conductive film.

Figure 4A:
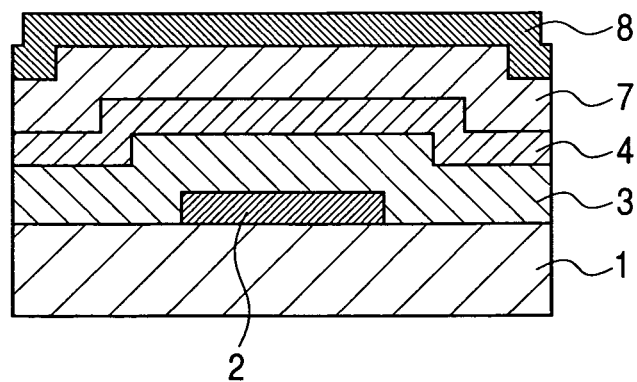
FIGS. 4A, 4B and 4C are cross-sectional views illustrating the production steps of the thin film transistor according to the embodiment of the present invention.

As the process of forming the transparent conductive film, a vapor phase process such as sputtering, pulse laser evaporation, or electron beam evaporation is desirably used. However, the film formation process is not limited to those processes. Through the above-mentioned steps, a structure illustrated in FIG. 4A is completed.

Figure 4B:
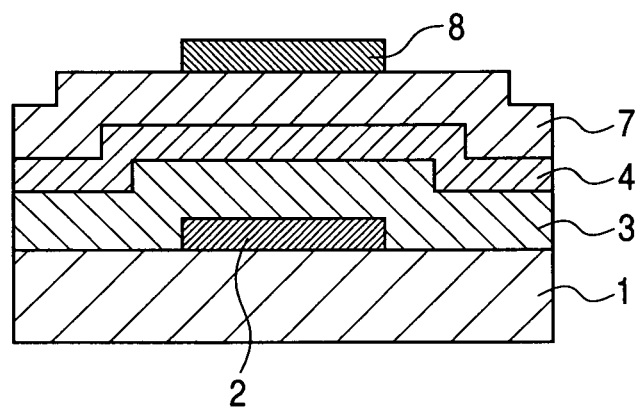

Then, as a sixth step, by patterning the transparent conductive film, the second gate electrode 8 is formed. Through the above-mentioned steps, a structure illustrated in FIG. 4B is completed.

Figure 4C:
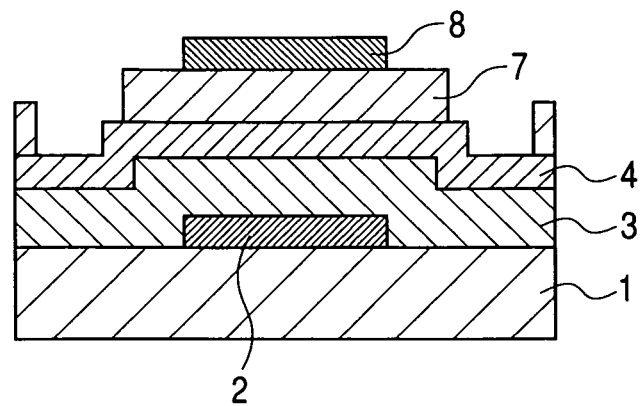

Next, as a seventh step, by patterning the second insulator film, the second gate insulating layer 7 is formed. A structure formed by the process up to and including this step is illustrated in FIG. 4C.

Next, as an eight step, a second conductive film is deposited on the second gate insulating layer 7 and the second gate electrode 8. A film containing at least one kind of metal is used as the second conductive film. Alternatively or additionally, a conductive metal oxide ($MO_x$ wherein M represents a metal element) may be used.

The second conductive film may have either a single layer structure or a stack structure consisting of a plurality of layers. As the process of forming the second conductive film, a vapor phase process such as sputtering, pulse laser evaporation, or electron beam evaporation is desirably used. However, the film formation process is not limited to those processes.

Then, by patterning the second conductive film, the contact electrodes 9 are formed. A structure formed by the process up to and including this step is illustrated in FIG. 5.

In the above, an example of the production steps of the thin film transistor according to the present invention is described.

In the production steps described above, the film thickness of the first gate electrode has an upper limit in order to form various kinds of layers thereon with good step coverage. The upper limit is the maximum film thickness with which the step coverage is satisfactory and does not adversely affect the TFT characteristics.

According to the findings of the present inventors, the film thickness of the first gate electrode may be approximately similar to the film thickness of the gate insulating film.

Incidentally, the term "step coverage" herein employed refers to such characteristics that when a coating film is formed on a substrate or the like having a step (or step difference) (for example, a substrate having a gate electrode thereon as a step), continuous coating can be attained without interruption at the step portion.

Furthermore, the term "good step coverage" herein employed refers to, for example, a state in which when a gate electrode of a TFT is covered with an insulating layer, the insulation property is not lowered and the TFT characteristics are not degraded, and also refers to a state in which when an underlayer having a step is covered with a semiconductor layer, the TFT characteristics are not degraded.

Moreover, in a case where a first gate electrode is formed so as to also serve as wiring, in order to make the voltage drop fall within an allowable value range, the film thickness has a lower limit. The lower limit is the minimum film thickness with which the voltage drop does not adversely affect the TFT characteristics.

According to the findings by the present inventors, the lower limit of the film thickness is the order of 10 nm or so. The film thickness of the first gate electrode is determined to be between the upper limit and the lower limit. On the other hand, with regard to the second gate electrode, because only a protective layer is formed thereon, the upper limit of the film thickness of the second gate electrode may be larger than that of the first gate electrode. The second gate electrode also functions as a protective layer for protecting the semiconductor layer, and as the film thickness is larger, the effect thereof is greater.

Therefore, making the thickness of the second gate electrode equal to or larger than that of the first gate electrode is effective in operating the thin film transistor stably.

In T. Miyasato et al., Applied Physics Letters, 86 (2005), p. 162902, an ITO film which is used generally as a conductive film is completely depleted by using a ferroelectric BLT gate insulating layer to thereby realize OFF state of a thin film transistor.

However, in the technology disclosed in T. Miyasato et al., Applied Physics Letters, 86 (2005), p. 162902, because the step of forming the BLT gate insulating layer requires heat treatment at a temperature as high as 750° C., a low-cost material such as glass or plastic can not be used as the substrate.

On the other hand, in the method of producing a thin film transistor according to the present invention, because all the steps can be carried out at room temperature, a low-cost material such as glass or plastic can be used as the substrate.

Furthermore, because the thin film transistor according to the present invention has a double-gate structure, an effectively high electric field can be applied to the semiconductor layer. Therefore, similarly to the case disclosed in T. Miyasato et al., Applied Physics Letters, 86 (2005), p. 162902, a semiconductor layer having a reduced resistance can be depleted, whereby transistor operation can be attained.

Furthermore, in the sixth step, for example, by performing back side light exposure with the first gate electrode 2 being used as a photomask, the transparent conductive film can be patterned. At that time, it is necessary to expose a resist film formed on a surface of a sample to light via a stack film. Therefore, in order to expose the resist film to light in the patterning in the first to the fifth steps, the transmittance to light having a wavelength of 365 nm or more used in an exposure device is set to 50% or more, and more preferably 80% or more.

Moreover, by making the material of the second gate electrode and the material of the contact electrodes identical to each other, the sixth step and the eighth step can be carried out at the same time.

In addition, by making at least one of the first gate electrode and the second gate electrode shield light having a specific wavelength, the electrode can be provided with a function as a light-shielding layer. The term "light having a specific wavelength" as herein employed refers to light having a wavelength of 365 nm or more used in an exposure device.

Furthermore, in the method of producing a thin film transistor, it is also possible to lower the resistance of the semiconductor layer 4 under the influence of a film forming atmosphere of at least one of the first gate insulating layer 3 and the second gate insulating layer 7 and hydrogen contained in those films. Also in this case, transistor operation can be attained for the above-mentioned reason.

Moreover, because of the planar structure, parasitic capacitance generated between the gate electrode and the drain electrode can be made minimum and uniform. By making the gate electrode opaque, it is also possible to make the gate electrode function as a light-shielding layer.

Figure 1A:
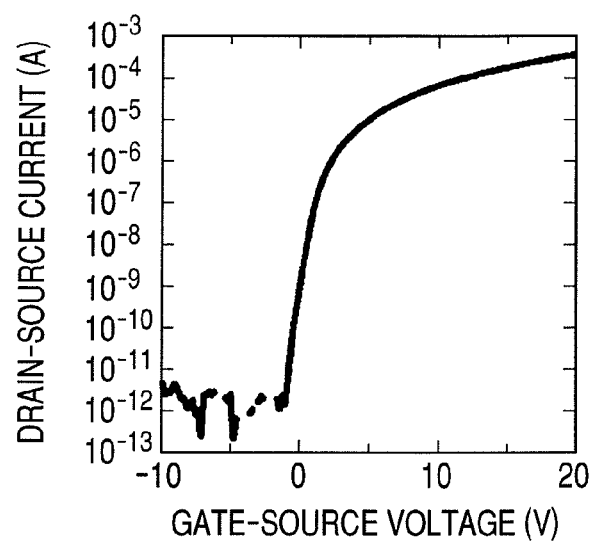
FIGS. 1A and 1B are graphical representations showing transfer characteristics of a thin film transistor.
Figure 1B:
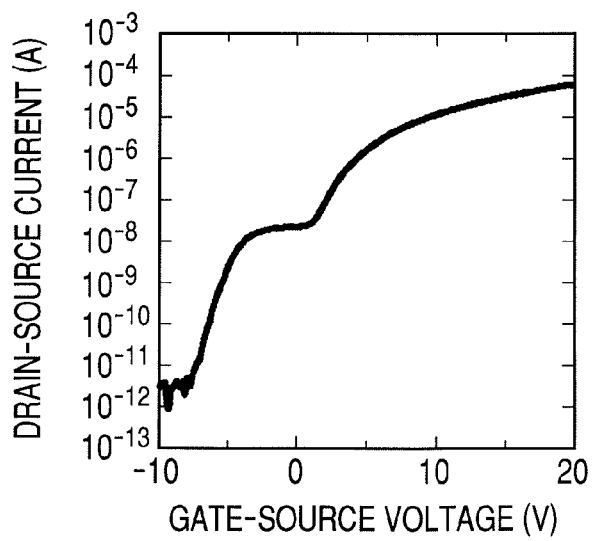

For a double-gate thin film transistor produced in this manner, even if the transfer characteristics of the device have a hump in single-gate driven mode, characteristics free of a hump can be obtained in double-gate driven mode. FIG. 1A shows typical transfer characteristics of a thin film transistor free of a hump, while FIG. 1B shows typical transfer characteristics of a thin film transistor having a hump.

Incidentally, the term "single-gate driving" as herein employed refers to a driving method in which one of the gate electrodes is driven with the other of the gate electrodes being grounded.

EXAMPLES

The present invention is now described in further detail below with reference to Examples. It is to be noted that the present invention is by no means limited to the examples.

Example 1

Figure 7:
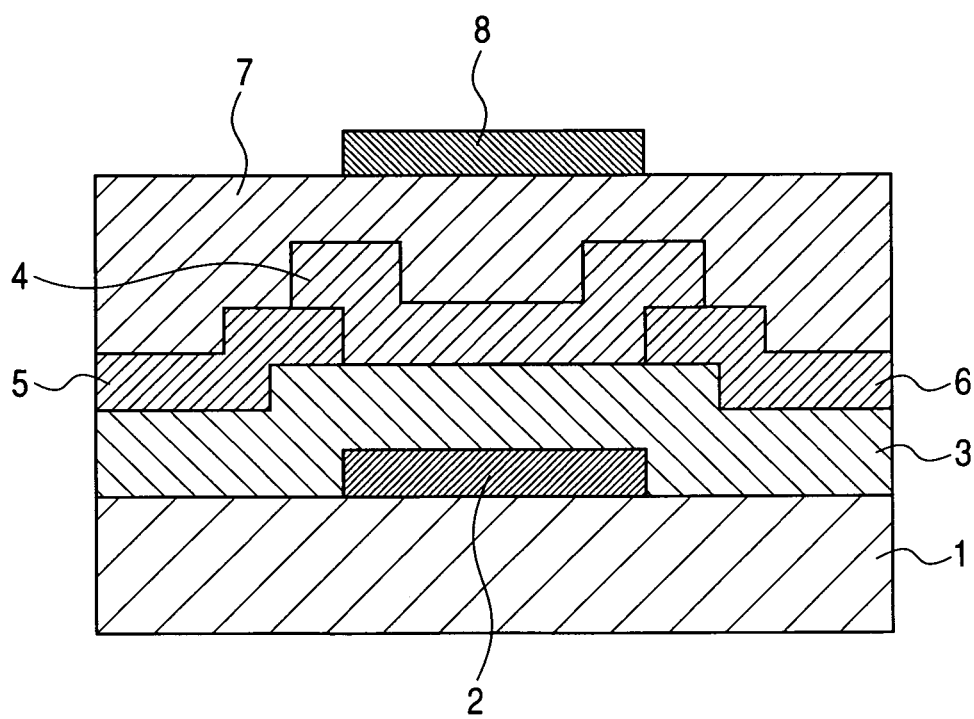
FIG. 7 is a cross-sectional view illustrating the configuration of the thin film transistor according to Example 1 of the present invention.

FIG. 7 is a cross-sectional view illustrating the configuration of a thin film transistor according to Example 1 of the present invention. As illustrated in FIG. 7, this example is a bottom-contact type double-gate thin film transistor. The thin film transistor illustrated in FIG. 7 is formed on a substrate 1.

More specifically, a first gate electrode 2, a first gate insulating layer 3, a drain electrode 5, a source electrode 6, a semiconductor layer 4, a second gate insulating layer 7, and a second gate electrode 8 are formed on the substrate 1.

A glass substrate (No. 1737 manufactured by Corning Incorporated) is used as the substrate 1. The thickness of the glass substrate is 0.5 mm.

A Mo thin film is formed on the substrate 1 in the thickness of 50 nm. In this example, DC magnetron sputtering using an atmosphere of an argon gas is used to form the MO thin film.

Figure 6A:
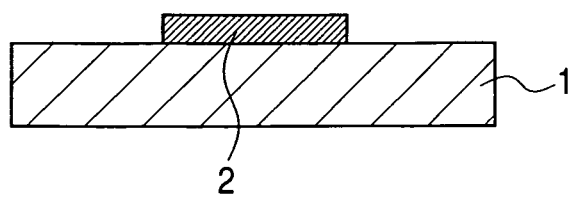
FIGS. 6A, 6B, 6C, 6D and 6E are cross-sectional views illustrating production steps of a thin film transistor according to Example 1 of the present invention.

Then, the deposited Mo thin film is finely processed by photolithography and dry etching to form the first gate electrode 2 (FIG. 6A).

Then, an $SiO_2$ thin film is formed on the first gate electrode 2 in a thickness of 200 nm by RF magnetron sputtering.

With respect to the film formation conditions, the substrate temperature is set to room temperature, the input RF power is set to 400 W, the supply flow rate of argon gas is set to 10 sccm, and the chamber pressure is set to 0.1 Pa.

Figure 6B:
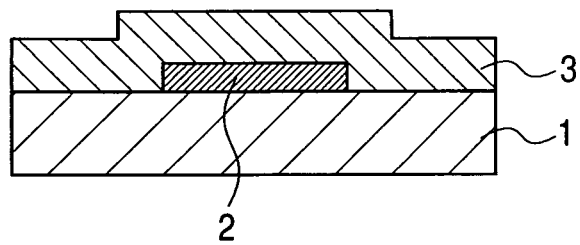

The deposited $SiO_2$ thin film is patterned by photolithography and wet etching using a buffered hydrofluoric acid solution to form the first gate insulating layer 3 (FIG. 6B).

Then, an ITO thin film is formed on the first gate insulating layer 3 in a thickness of 100 nm by DC magnetron sputtering.

With respect to the film formation conditions, the substrate temperature is set to room temperature, the input RF power is set to 200 W, the supply flow rate of argon gas is set to 100 sccm, and the chamber pressure is set to 0.2 Pa. The ITO thin film produced in this manner is amorphous.

Then, the deposited ITO thin film is finely processed by photolithography and wet etching.

Figure 6C:
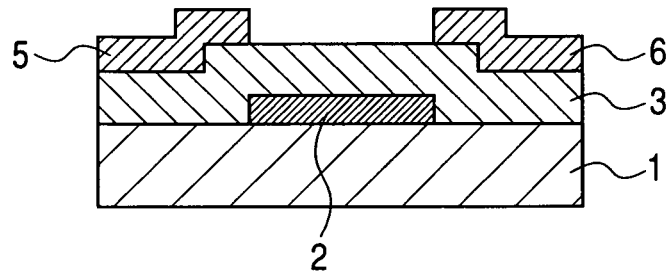

Then, the finely-processed ITO thin film is converted into a polycrystalline ITO thin film by heat treatment at 270° C. for 20 minutes, whereby the drain electrode 5 and the source electrode 6 are formed (FIG. 6C).

Then, on the first gate insulating layer 3, the drain electrode 5, and the source electrode 6a, a thin film of an oxide semiconductor In—Ga—Zn—O is formed in a thickness of 40 nm by RF magnetron sputtering.

With respect to the film forming conditions, the substrate temperature is set to room temperature, the input RF power is set to 200 W, the supply flow rate of argon gas containing 5% of oxygen is set to 25 sccm, and the chamber pressure is set to 0.5 Pa. The In—Ga—Zn—O thin film produced in this manner is amorphous, and the compositional ratio of In:Ga:Zn:O is approximately 1:1:1:4.

Figure 6D:
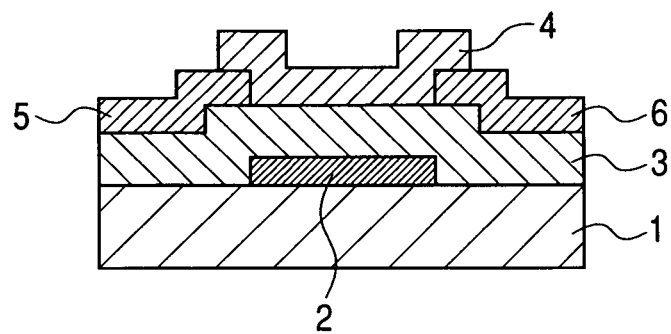

Then, the deposited In—Ga—Zn—O thin film is patterned by photolithography and wet etching using hydrochloric acid to form the semiconductor layer 4 (FIG. 6D).

Then, on the semiconductor layer 4, an SiO$_2$ thin film is formed in a thickness of 200 nm by RF magnetron sputtering.

With respect to the film formation conditions, the substrate temperature is set to room temperature, the input RF power is set to 400 W, the supply flow rate of argon gas is set to 10 sccm, and the chamber pressure is set to 0.1 Pa.

Figure 6E:
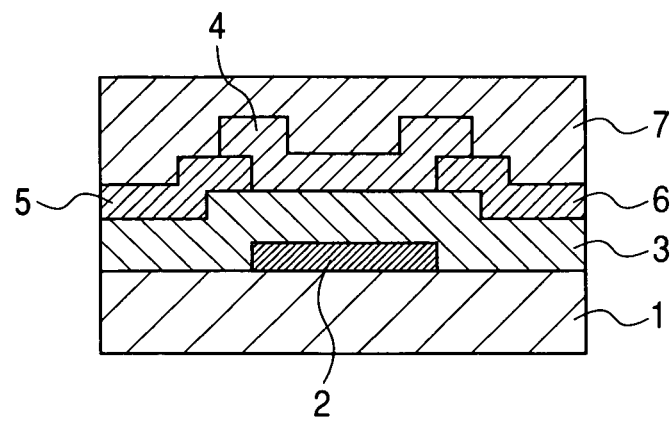

The thus deposited SiO$_2$ thin film is patterned by photolithography and wet etching using a buffered hydrofluoric acid solution to form the second gate insulating layer 7 (FIG. 6E).

Then, on the second gate insulating layer 7, an Mo thin film is formed in a thickness of 100 nm. The film formation conditions are the same as those for the first gate electrode 2.

Then, the thus deposited Mo thin film is finely processed by photolithography and dry etching to form the second gate electrode 8 (FIG. 7).

The bottom-contact type double-gate thin film transistor produced as described above exhibits the transfer characteristics free of a hump as shown in FIG. 1A when driven with the same potential being applied to the first gate electrode 2 and the second gate electrode 8.

Further, because the first gate electrode 2 and the second gate electrode 8 are made of the metal and shield light, they also function as light-shielding layers.

As described above, in the thin film transistor of this example, occurrence of a hump in the transfer characteristics is suppressed and the effect of shielding light to be incident on the semiconductor layer is realized.

Comparative Example

When the thin film transistor produced in Example 1 was operated in single-gate driven mode with the second gate electrode 8 being grounded and a voltage being applied to the first gate electrode 2, a hump was observed in the transfer characteristics as shown in FIG. 1B.

It can be seen from the comparison as described above that double-gate driving can suppress occurrence of a hump in the transfer characteristics.

Example 2

Figure 10:
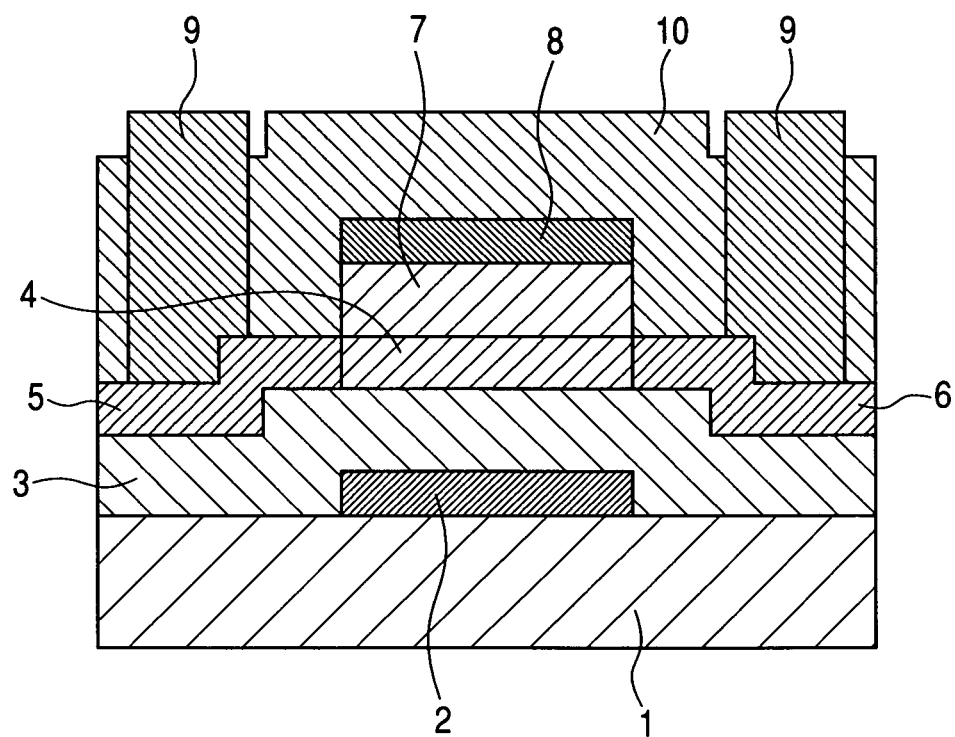
FIG. 10 is a cross-sectional view illustrating the configuration of the thin film transistor according to Example 2 of the present invention.

FIG. 10 is a cross-sectional view illustrating the configuration of a thin film transistor according to Example 2 of the present invention. This example is an example of forming a planar double-gate thin film transistor. The thin film transistor illustrated in FIG. 10 is formed on a substrate 1.

More specifically, on the substrate 1, there are formed a first gate electrode 2, a first gate insulating layer 3, a semiconductor layer 4, a drain electrode 5, a source electrode 6, a second gate insulating layer 7, a second gate electrode 8, contact electrodes 9, and a protective layer 10.

A glass substrate (No. 1737 produced by Corning Incorporated) is used as the substrate 1. The thickness of the glass substrate is 0.5 mm.

First, a Mo thin film is formed on the substrate 1 in a thickness of 50 nm. In this example, DC magnetron sputtering using an atmosphere of argon gas is used to form the Mo thin film.

Figure 8A:
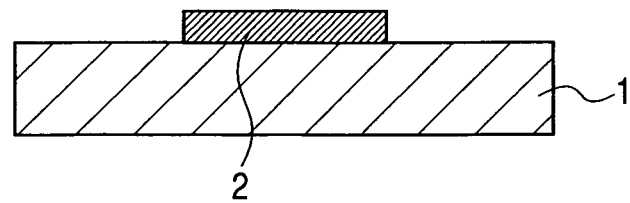
FIGS. 8A, 8B, 8C and 8D are cross-sectional views illustrating production steps of a thin film transistor according to Example 2 of the present invention.

Then, the deposited Mo thin film is finely processed by photolithography and dry etching to form the first gate electrode 2 (FIG. 8A).

Then, an SiO$_2$ thin film is formed on the first gate electrode 2 in a thickness of 200 nm by RF magnetron sputtering.

With respect to film formation conditions, the substrate temperature is set to room temperature, the input RF power is set to 400 W, the supply flow rate of argon gas is set to 10 sccm, and the chamber pressure is set to 0.1 Pa.

Figure 8B:
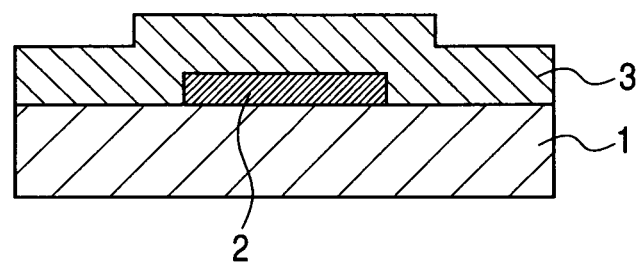

The thus deposited SiO$_2$ thin film is patterned by photolithography and wet etching using a buffered hydrofluoric acid solution to form the first gate insulating layer 3 (FIG. 8B).

Then, a thin film of an oxide semiconductor In—Ga—Zn—O is formed on the first gate insulating layer 3 in a thickness of 40 nm by RF magnetron sputtering.

With respect to the film formation conditions, the substrate temperature is set to room temperature, the input RF power is set to 200 W, the supply flow rate of argon gas containing 5% of oxygen is set to 25 sccm, and the chamber pressure is set to 0.5 Pa. The In—Ga—Zn—O thin film produced in this manner is amorphous, and the compositional ratio of In:Ga:Zn:O is approximately 1:1:1:4.

Figure 8C:
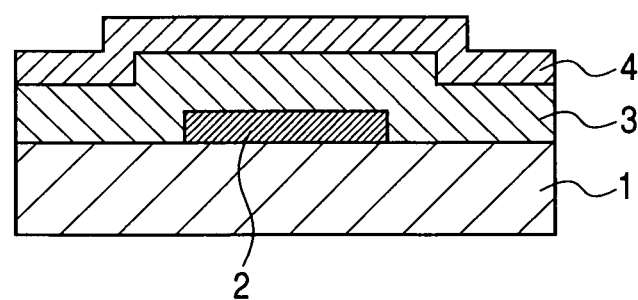

The deposited In—Ga—Zn—O thin film is patterned by photolithography and wet etching using hydrochloric acid to form the semiconductor layer 4 (FIG. 8C).

Figure 8D:
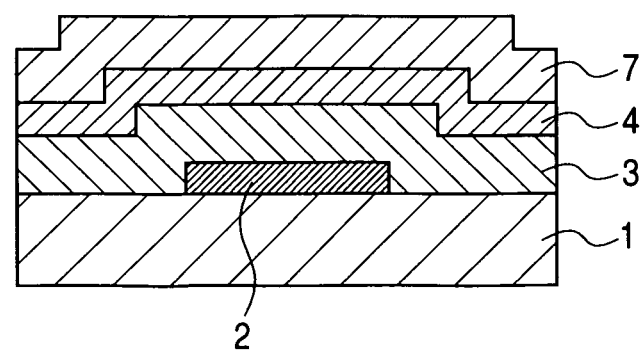

Then, an SiO$_2$ thin film is formed on the semiconductor layer 4 in a thickness of 300 nm by RF magnetron sputtering. With respect to the film formation conditions, the substrate temperature is set to room temperature, the input RF power is set to 400 W, the supply flow rate of argon gas is set to 10 sccm, and the chamber pressure is set to 0.1 Pa (FIG. 8D).

Figure 9A:
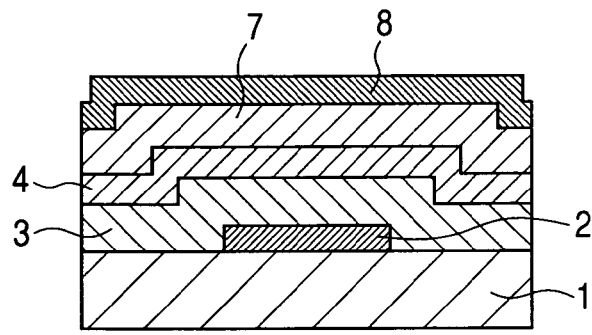
FIGS. 9A, 9B, 9C and 9D are cross-sectional views illustrating the production steps of the thin film transistor according to Example 2 of the present invention.

Then, an ITO thin film is formed on the SiO$_2$ thin film in a thickness of 100 nm by DC magnetron sputtering. With respect to the film formation conditions, the substrate temperature is set to room temperature, the input RF power is set to 200 W, the supply flow rate of argon gas is set to 100 sccm, and the chamber pressure is set to 0.2 Pa. The ITO thin film produced in this manner is amorphous (FIG. 9A)

Then, a resist is patterned by back side light exposure with the first gate electrode 2 being used as a photomask, and the ITO thin film is patterned by wet etching to form the second gate electrode 8. Then, the SiO$_2$ thin film is patterned by dry etching to form the second gate insulating layer 7.

Figure 9B:
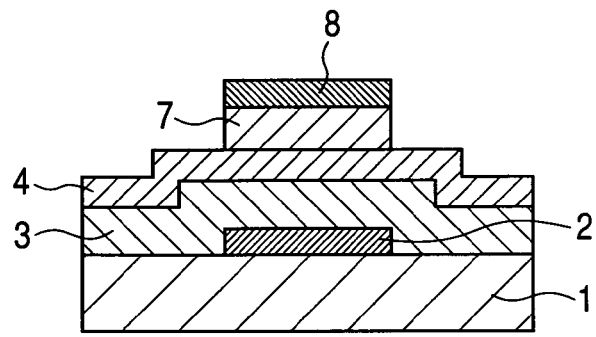

After that, the ITO thin film is converted into a polycrystalline ITO thin film by heat treatment at 270° C. for 30 minutes (FIG. 9B).

Then, an SiN thin film is formed on the second gate electrode 8 and the semiconductor layer 4 in a thickness of 300 nm by plasma CVD.

The substrate temperature when the SiN thin film is formed by the plasma CVD is set to 250° C. SiH$_4$, NH$_3$ and N$_2$ are used as the process gases with the gas flow rate ratio being set to SiH$_4$:NH$_3$:N$_2$=1:2.5:25. The input RF power density and the pressure are 0.9 W/cm$^2$ and 150 Pa, respectively.

Figure 9C:
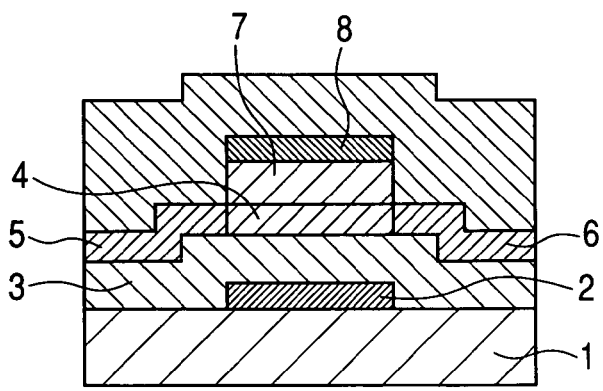

Here, the resistance of regions of the semiconductor layer 4 which are in contact with the SiN thin film is greatly lowered under the influence of the film forming atmosphere of the SiN thin film and hydrogen contained in the thin film. Such regions of the semiconductor layer 4 having the lowered resistance are used as the drain electrode 5 and the source electrode 6 (FIG. 9C).

Figure 9D:
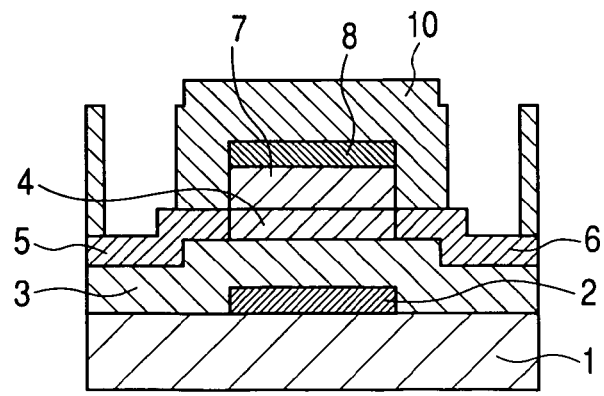

Then, the SiN thin film is patterned by photolithography and dry etching to form the protective layer 10 (FIG. 9D).

Then, a Mo thin film is formed on the protective layer 10 in a thickness of 100 nm. The film formation conditions are the same as those when the first gate electrode 2 is formed.

Then, the deposited Mo thin film is finely processed by photolithography and dry etching to form the contact electrodes 9 (FIG. 10).

For the planar double-gate thin film transistor produced in this manner, even if the transfer characteristics of the device have a hump in single-gate driven mode, characteristics free of a hump can be obtained in double-gate driven mode.

Further, because of the planar structure, a parasitic capacitance generated between the gate electrode and the drain electrode can be made to be minimum and uniform.

As described above, the thin film transistor and the production method of the same of the examples can realize the effect of suppressing occurrence of a hump in the transfer characteristics, reducing and making uniform the parasitic capacitance by virtue of the planar structure, and reducing the number of production steps and realizing self-alignment by virtue of back side light exposure.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-012593, filed Jan. 23, 2008, which is hereby incorporated by reference herein in its entirety.

The invention claimed is:

1. A thin film transistor comprising:
 a substrate;
 a first gate electrode formed on said substrate;
 a first gate insulating layer formed so as to cover said first gate electrode;
 a semiconductor layer comprising an oxide semiconductor and formed on said first gate insulating layer;
 a second gate insulating layer formed on said semiconductor layer;
 a second gate electrode formed on said second gate insulating layer; and
 a drain electrode and a source electrode formed so as to be connected to said semiconductor layer,
 wherein said second gate electrode has a thickness larger than a thickness of said first gate electrode, and
 wherein a thickness of said first gate electrode is equal to or smaller than a thickness of said first gate insulating layer, and
 wherein said first gate electrode, said first gate insulating layer, said second gate insulating layer, said semiconductor layer, said drain electrode, and said source electrode have a transmittance of 50% or more for light having a wavelength of 365 nm or more.

2. The thin film transistor according to claim 1, wherein at least one of said drain electrode and said source electrode is in contact with said semiconductor layer.

3. The thin film transistor according to claim 1, wherein said semiconductor layer comprises an oxide semiconductor containing at least one element selected from the group consisting of Zn, Ga, In and Sn.

4. The thin film transistor according to claim 1, wherein said semiconductor layer comprises an oxide semiconductor containing In—Ga—Zn—O.

5. A thin film transistor comprising:
 a substrate;
 a first gate electrode formed on said substrate;
 a first gate insulating layer formed so as to cover said first gate electrode;
 a semiconductor layer comprising an oxide semiconductor and formed on said first gate insulating layer;
 a second gate insulating layer formed on said semiconductor layer;
 a second gate electrode formed on said second gate insulating layer; and
 a drain electrode and a source electrode formed so as to be connected to said semiconductor layer,
 wherein said second gate electrode has a thickness larger than a thickness of said first gate electrode, and
 wherein a thickness of said first gate electrode is equal to or smaller than a thickness of said first gate insulating layer,
 wherein at least one of said first gate electrode and said second gate electrode has a transmittance of 50% or less for light having a wavelength of 365 nm or more.

6. The thin film transistor according to claim 5, wherein at least one of said drain electrode and said source electrode is in contact with said semiconductor layer.

7. The thin film transistor according to claim 5, wherein said semiconductor layer comprises an oxide semiconductor containing at least one element selected from the group consisting of Zn, Ga, In and Sn.

8. The thin film transistor according to claim 5, wherein said semiconductor layer comprises an oxide semiconductor containing In—Ga—Zn—O.

* * * * *